United States Patent [19]

Hopfer

[11] 4,392,108

[45] Jul. 5, 1983

[54] BROADBAND RADIATION DETECTOR FOR MICROWAVE AND LOWER FREQUENCIES

[75] Inventor: Samuel Hopfer, Brooklyn, N.Y.

[73] Assignee: General Microwave Corporation, Farmingdale, N.Y.

[21] Appl. No.: 143,365

[22] Filed: Apr. 24, 1980

Related U.S. Application Data

[63] Continuation-in-part of Ser. No. 883,632, Mar. 6, 1978, Pat. No. 4,207,518.

[51] Int. Cl.³ .................... G01R 21/10; G01R 19/22
[52] U.S. Cl. .................................... 324/95; 324/72.5; 324/119; 343/703
[58] Field of Search ............... 324/95, 72.5, 106, 119; 340/600; 343/703, 701; 455/67

[56] References Cited

U.S. PATENT DOCUMENTS 3,750,017 7/1973 Bowman et al. ................. 324/95

OTHER PUBLICATIONS

Rudge et al., "Near Field Instrumentation"; BRH-DEP 70-16; Jul. 1970.

Primary Examiner—Ernest F. Karlsen
Attorney, Agent, or Firm—Morton C. Jacobs

[57] ABSTRACT

A radiation detector for free space microwave radiation uses thin film resistive strips, having an equivalent surface resistivity that is large compared to the characteristic impedance of free space, and diode circuits in series with the strips for deriving d-c signals monitoring the radiation intensity over a broad frequency range. In part of that range, the strips operate like a short dipole antenna. The diode circuits are constructed to operate with a uniform response over the entire frequency range.

6 Claims, 8 Drawing Figures

BROADBAND RADIATION DETECTOR FOR MICROWAVE AND LOWER FREQUENCIES

BACKGROUND OF THE INVENTION

This is a continuation-in-part of co-pending patent application Ser. No. 883,632, filed Mar. 6, 1978, now U.S. Pat. No. 4,207,518.

This invention relates to radiation detection devices for electromagnetic radiation in free space, and particularly to such devices which are useful for a broadband of radio frequencies.

A detector for free space radiation over a broadband of radio frequencies, particularly in the microwave spectrum, is described in applicant's paper. "Design of Broad-Band Resistive Radiation Probes", IEEE Tr. Instr. and Meas., November, 1972, Vol. IM-21, No. 4, pp. 416–421, and in his patent U.S. Pat. No. 3,931,573, which are here incorporated by reference. Such a detector is desirably achieved by an arrangement of resistive strips for extracting and absorbing radiant energy from the free space field rather than by an antenna. The resistive strips keep the effects of reflection and diffraction to a minimum, and the resistive strip arrangement has sufficient transparency so as not to distrub the field being measured and detected. The fractional absorption of the radiant energy by the resistive strips is substantially invariant with frequency, so that an ultra broadband radiation detecting device is thereby produced. This resistive strip detector is unlike an antenna which uses metallic surfaces of negligible resistance, for the resistive strips do not disturb the near field being measured. Applicant's aforementioned paper and patent describe a specific embodiment using thermocouples for converting the absorbed r-f energy to a d-c measurement signal.

Other radiation detectors use antennas (i.e., transducers having conventional highly conductive surfaces). These detectors tend to produce disturbance in the field being measured due to the conductive materials, and to be narrow band by reason of the frequency sensitivity of the antenna. However, by using a "short" dipole antenna (i.e., a small fraction of a wavelength at the high frequency end of the band), and with a high reactance relative to the characteristic free-space impedance, somewhat broader bands have been achieved; see "New Near-Zone Electric-Field-Strength Meter" by F. M. Greene, NBS J. of Research—C. Eng. and Instr., Vol. 71C, No. 1, Jan.—Mar. 1967, pp. 51–57; "Near Field Instrumentation", report of A. W. Rudge, et al, July, 1970, Bureau of Radiological Health of U.S. Dept. H.E.W.; and U.S. Pat. Nos. 3,750,017 of Bowman, et al and 4,008,477 of Babij, et al. These detectors use diodes for converting the r-f currents induced in the antennas to a d-c measurement signal, which have the advantage of higher sensitivity. Practical constraints may limit such detectors to frequencies up to a few gigaHerz.

Known probes using short dipole antennas with loads of Schottky barrier diodes are constructed to have a broad bandwidth by compensating for the frequency dependent diode. The diode impedance in the frequency range of operation, is largely characterized by its barrier capacity. This capacitance is in series with that of the short dipole whose coupling action to free space is also essentially represented by an equivalent capacitance. For as long as the total circuit reactance is large relative to free space impedance, a condition which sets the upper frequency limit, the induced voltage for constant power density remains constant with frequency. As a consequence of the capacitive divider network, the induced voltage across the diode is a constant. This accounts for the probe's flat characteristic of output with frequency. The lower frequency limit is reached when the barrier capacitive reactance becomes comparable to the barrier resistance.

In applicant's co-pending patent application, a radiation monitor is disclosed in which a broadband operation in the microwave spectrum is maintained, and a high degree of sensitivity is achieved. A diode monitoring circuit is used, which includes means that ensures a constant operation with frequency over that frequency band, notwithstanding the capacitive reactance of the diodes that are used. This operation holds true generally in the microwave frequency band; however, at low frequencies, the behavior changes to that of a short dipole characterized by a substantial space-coupling capacitance, which thereby limits the broadband characteristic at those low frequencies.

The broadband radiation monitor described in applicant's co-pending application is limited somewhat in its operating range by reason of capacitive effects at radio frequencies somewhat below the microwave region, and these capacitive effects increase substantially as the frequency decreases. In particular, at very low frequencies, it has been found that the capacitive effects are the dominant ones of the antenna, and the device acts similar to a conventional short dipole.

SUMMARY OF THE INVENTION

It is among the objects of this invention to provide a new and improved radiation detector for free-space radiation.

Another object is to provide a new and improved detector for free-space radiation which is effective over a broadband of radio frequencies, both microwave and lower frequencies.

Another object is to provide a new and improved free-space radiation detector which has a high degree of sensitivity.

In one form of the invention, a radiation detector uses thin resistive strips having a substantial d-c resistance greater than the characteristic impedance of free-space for producing r-f currents whose amplitudes are generally constant over a band of microwave frequencies, and which vary with frequency over a band of lower frequencies. A monitoring circuit, including a diode, is provided for converting the r-f currents to corresponding d-c signals. This circuit is formed of elements having resistance and reactance, and particularly a negligible reactance over the broad band of microwave frequencies, and a substantial reactance over a broad band of lower frequencies. The resistive strips and resistance of the converting circuit form a resistive divider over the microwave band, and the reactances of the resistive strip and of the converting circuit form a reactance divider over the lower frequencies, whereby the d-c signals are substantially constant with frequency over both the microwave and lower frequency bands.

In a particular embodiment of this invention, an isotropic radiation monitor is built with three loops, each leg of which contains a thin film resistive strip fabricated by vacuum deposition on opposite sides of a thin dielectric substrate, which is preferably only a few thousandths of an inch thick. Thereby, the resistive strips on the same side of the substrate are deposited at the same time, and the effective loop area that interacts with the H-field is minimized, so that the interaction is essentially limited to the E-field. Three such resistive legs, spaced by equal angles, are formed on three planar legs of the substrate that are correspondingly spaced. The three legs are mounted on three planar surfaces similarly inclined with respect to the axis of a wand handle to form three resistive strips extending in three mutually orthogonal directions for isotropic operation. A gap in the strip in one leg of each loop is bridged by a diode and other elements of the monitoring circuit; the strip in the other leg provides d-c continuity. The strips of the three loops are interconnected, so that only two terminals are required to connect to resistive leads in a long probe tube that, in turn, are connected to a metering circuit. A filtering circuit is formed by a capacitor across the two resistive legs of each loop, which provides a time constant larger than the period at the lowest operating frequency.

BRIEF DESCRIPTION OF THE DRAWINGS

The foregoing and other objects of this invention, the various features thereof, as well as the invention itself, will be more fully understood from the following description, when read together with the accompanying drawing in which.

DESCRIPTION OF A PREFERRED EMBODIMENT

Figure 1:
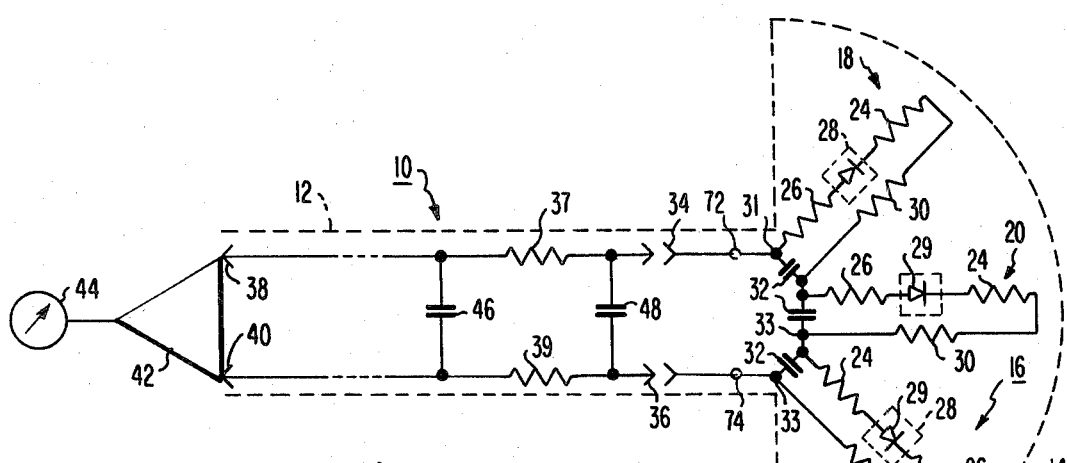
FIG. 1 is a schematic, equivalent circuit diagram of an isotropic broadband radiation monitor embodying this invention.

In the drawing corresponding parts are referenced by similar numerals throughout.

In the schematic circuit diagram of FIG. 1, the radiation monitor probe 10 of this invention is made up of a rigid dielectric wand 12 shown in broken lines which may include a handle remote from an opaque dielectric housing 14, (such as styroforam sphere) that encloses the probe element 16. As shown schematically within the housing 14, the probe element consists of three loops 18, 20 and 22. Each of the three loops is constructed in a similar fashion and mounted (for example, in ways known in the art) to extend in three orthogonal directions to interact respectively with three orthogonal components of the E-field, and which together operate for isotropic monitoring of free-space radiation.

The loop 18 consists of two resistive half-strips 24, 26 spaced by a small gap that is bridged by a diode circuit 28 (represented in simple form by a single diode 29). The return leg is a highly resistive strip 30 which provides d-c continuity. Connected across the inner terminals 31, 33 of the two legs of loop 18 is an integrating capacitor 32, that forms a circuit with the high resistances of strips 24, 26, 30 of that loop 18 that provides a time constant that is larger than the period of the lowest r-f frequencies to be monitored. Each of the other loops 20 and 22 is similarly constructed and corresponding parts are referenced by similar numerals.

These three loops 18, 20 and 22 are connected in series for d-c continuity with the diodes arranged in series-aiding relationship. Each diode operates in its square-law region and produces d-c voltages proportional to the square of the component of the E-field along the associated leg. The voltages from the three loops are summed algebraically to provide a total d-c voltage representative of the sum of the squares of the individual d-c voltages, and thereby representative of the E-field along the associated leg.

The outer terminal 31 of loop 18 and terminal 33 of loop 22 are connected through suitable contacts 34, 36 (e.g., of a known bellows type) to very high resistance leads 37, 39 that extend along the length of the wand 12 and are connected to external terminals 38, 40 which may provide connection to a suitable coaxial connector to an amplifier 42 and metering circuit 44, on which the wand may be mounted for use. Large by-pass capacitors 46 and 48 are connected at either end of the resistive leads 37 and 39 to provide an isolating loop for any r-f or a-c currents induced in the resistive leads, and thereby isolate that loop from the amplifier 42 and from the probe.

All connecting elements that may effect the radiation field being detected (e.g., those to amplifier 42) are preferably formed of highly resistive material to avoid disturbing that field, and any highly conductive connectors (used, for example, where contacts are formed) are made very small dimensionally compared to the wavelength at the highest frequency in the frequency range being measured, in a manner well known to those skilled in the art.

Figure 2:
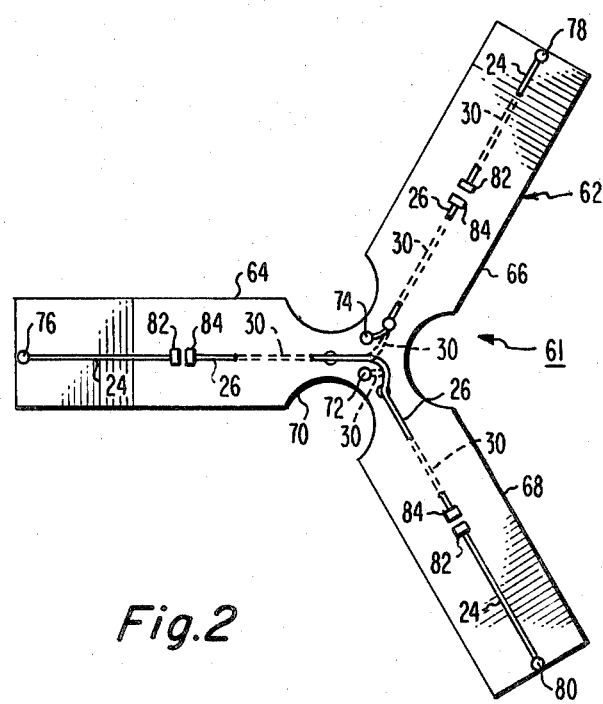
FIG. 2 is a plan view of a radiation detection element used in the assembly of the isotropic probe of FIG. 1.
Figure 3:
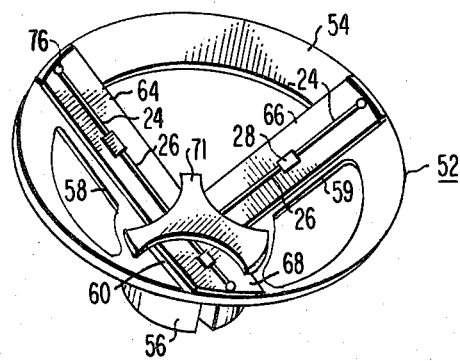
FIG. 3 is a perspective view of a conical probe assembly mount with the thin film element mounted thereon.

The probe element 16 in one form of the invention includes a conical assembly mount 52 (FIG. 3) which comprises a large circular ring 54 and a small cylindrical base 56 interconnected by three inclined planar arms 58, 60 and 62. The probe sensing element 61 (FIG. 2) is formed on a substrate 62 having three arms 64, 66 and 68 which are generally planar, and which are mounted on the respective arms 58, 60 and 62 of the assembly mount 52. Cutouts 70 at the hub of the three-arm substrate permit the bending of the element thereat, and the use of an attachment plate 71 to hold the element 61 in position on the mount, as shown in FIGS. 2 and 3. The mount 52 is attached at the end of wand 12 and coaxially therewith, so that the arms form equal angles therewith.

On one face of each arm 64, 66, 68 of the substrate, there is deposited two spaced resistive strips 24, 26 of resistive material such as nichrome. The thicknesses of the resistive films 24, 26 are small compared to the skin depth at the highest operating frequency to insure uniformity of resistance over the operating frequency band, and to achieve the desired broadband operation; the term "thin film" is used herein to describe that mode of construction, which is achievable by vacuum deposition techniques. At the hub of the substrate, there are two passages through the substrate which are formed as probe terminals 72, 74 by suitable conducting material, such as silver film. Similarly, at the outer end of each arm 64, 66 and 68 of the substrate, is located through terminal 76, 78 and 80, respectively. At the adjacent ends of the resistive strips 24 and 26 are two contacts (e.g., formed as a deposition of silver film) 82, 84 which define the gap for mounting the diode monitoring circuit thereat. Similar contacts 82 and 84 are formed in the other legs as well. On substrate arm 64, the resistive strip 26 is formed to extend from contact 84 at the gap to its inner end where it joins the inner end of strip 26 on arm 68; the resistive strip 24 is formed between the terminal 76 and the contact 82; and on the reverse face of the substrate arm 64, the resistive strip 30 (FIGS. 1 and 4) is formed to extend from the terminal 76 to the inner end where it joins the inner end of strip 30 on arm 66.

A similar construction is provided for the other substrate arms 66 and 68 and for the corresponding resistive strips thereon, except that the inner end of strip 30 on arm 68 is connected to the probe terminal 72, and the inner end of strip 26 on arm 66 is connected to probe terminal 74. A d-c probe circuit is formed between terminals 72 and 74: from terminal 72 through strip 30 on the back face of arm 68, back through terminal 80 to the outer face of arm 68, and thereon through the strip 24, diode circuit 28 and strip 26 to its inner end where it joins the inner end of strip 26 on arm 64; then along the strips 26 and 24 and diode circuit 28 on the outer face of arm 64, through terminal 76 to the back face and along strip 30 of arm 64 to the inner end of strip 30 of arm 66; then along the strip 30 on the back face of arm 66 through terminal 78 to the front face, and along strips 24 and 26 and diode circuit 28 to the other probe terminal 74. The diode on arm 64 is oriented reversely from those on arms 66 and 68 (as shown schematically in FIG. 1) for the series-aiding relation.

Figure 4:
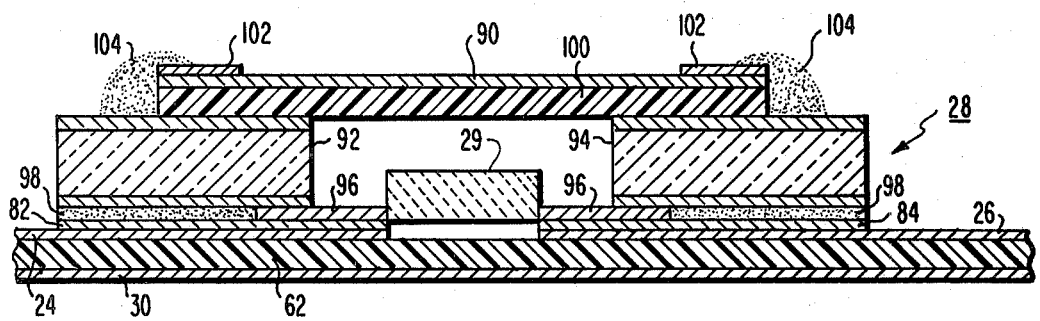
FIG. 4 is a cross-section view of a portion of one arm of the thin film element of FIG. 2 with the diode monitoring circuit assembly shown greatly enlarged.
Figure 5:
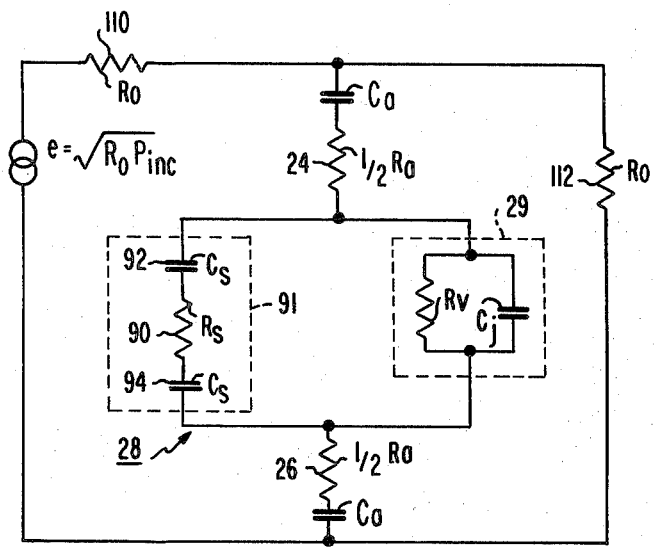
FIG. 5 is a schematic equivalent circuit of one leg of the probe in its relationship to free-space radiation.

The diode monitor circuit assembly is shown in FIG. 4 and the corresponding equivalent circuit is shown as part of FIG. 5. This monitor circuit 28 includes a shunt network resistor 90 and coupling capacitors 92, 94 on either side thereof. This series combination is connected as a shunt circuit to diode 29, which is shown (FIG. 5) in its schematic form, with a junction resistance $R_v$, and a junction capacitance $C_j$ due, for example, to the barrier capacitance of a Schottky barrier diode.

As shown in the cross-sectional view of FIG. 4 through the center of diode circuit 28, the mechanical assembly of this circuit 28 is made between the two spaced silver contact areas 82, 84. The Schottky diode 95 in the form of a thin rectangular box of small dimensions has its extending leads 96 secured to those silver contacts by a suitable conducting epoxy layer 98 on each contact 82, 84. The shunt capacitors 92, 94 also in the form of small rectangular boxes are secured respectively to the contacts 82 and 84 by means of the conductive epoxy layers 98. The shunt resistor 90 is deposited on a dielectric substrate 100. This resistive strip has a resistance somewhat less than the d-c resistance of the diode (as explained in applicant's co-pending patent application). At each end of the resistive strip, a silver contact 102 is provided and the silver contacts are electrically bonded to the terminals of the shunt capacitors 92 and 94 by a suitable conducting epoxy 104; the epoxy also ensures a good mechanical bond for all of the elements.

The time-constant capacitors 32 may be mounted on each substrate arm between the inner ends of the resistive strips 26 and 30 on the same arm. For this purpose, a through terminal is formed on each arm at those points, and the capacitor electrically bonded thereto and connected (by a conductive ribbon or other suitable connector) to the inner end of resistive strip 26 on the outer face; a suitable connector is formed on the back face between this through terminal and the inner end of strip 30. A single diode circuit for r-f to d-c conversion is used, which tends to improve the integration at low frequencies. That is, the phase imbalances at very low frequencies are thereby avoided. However, a diode circuit in each leg 30 may also be used.

When the probe element assembly 52 is mounted on the wand 12, the contacts 34 and 36 are closed, and the circuit completed as shown in FIG. 1, for operation of the probe. The resistive strips 26, 26 in one arm are at right angles to those in each of the other arms, and form separate measuring planes for the E-field; the angles of inclination of the assembly arms 58, 60, 62 are chosen in this way. The crossed strips that define each measuring plane also define the unit square of radiation which the probe element interacts with.

The operation of this circuit in the microwave region is explained in detail in the aforementioned copending application which is incorporated herein by reference. That is, the resistive strips 24, 26 in each arm and in each direction determine the interaction with the free-space radiation on a frequency independent basis. These half strips 24, 26 in each leg have a substantial length (e.g., about 1 inch) which defines the unit square of interaction with the E-field over the frequency range. The free-space radiation field that is detected has a characteristic impedance (377 ohms) much smaller than the equivalent surface resistance of the resistive strips 24, 26, 30 and is not disturbed, or otherwise adversely affected, by those resistive strips. By using a dimensionally small barrier device, such as a diode, as the element producing the d-c measurement signal, the r-f field is generally not affected. Though the diode's impedance is frequency sensitive, it is small compared to the series resistance of the strips 24, 26 in the same leg. Therefore, the strip resistance, essentially on a frequency-independent basis in the microwave region, establishes the induced r-f current corresponding to the energy extracted from free space, this r-f current for corresponding intensity levels of radiation is constant in amplitude with frequency. The shunt-network strip 90, which is resistive, and thus constant with frequency, establishes the r-f voltage applied across diode 29. Therefore, the voltage across each diode, for particular levels of intensity of free-space radiation, is constant with frequency.

In the equivalent circuit diagram of FIG. 5, $R_0$ represents the characteristic impedance of free space, which impedance 110 is shown as that of the equivalent generator or source of radiation as well as of the free space which normally serves as the load 112.

Figure 6A:
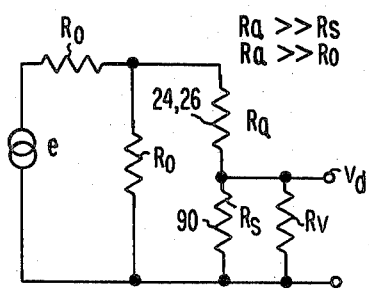
FIGS. 6A, B and C are equivalent circuit diagrams similar to the circuit of FIG. 5 used to explain the operation at different frequency ranges.

In the microwave or mid-band region, the reactance of the strips is small compared to that of the resistance of the strips 24, 26, and the latter resistance is large compared to the characteristic impedance of free space, and preferably some thousands of ohms. In addition, the antenna resistances $R_a$ are large compared to the shunt resistance 90, the latter being typically the order of 50 ohms. In this microwave region, the equivalent circuit of FIG. 5 reduces essentially to that of FIG. 6A. As can be seen, the monitor of each leg reduces essentially to a resistor divider composed of the strip resistances 24, 26 in series with the shunt resistance 90. Under those conditions, the voltage across the diode resistance $R_v$ remains constant with frequency. This resistance divider condition is limited at the high frequency end. The diode reactance must be greater than or equal to the shunt resistance. When the diode reactance is less than this value, it becomes an effective part of the circuit, and the shunt resistance is no longer effective to maintain a constant voltage across the diode. For a suitable Schottky diode, a typical junction capacitance is 0.08 pf; the reactance of that diode may be maintained greater than the shunt resistance for suitable sensitivity up to about 26 GHz.

Figure 6B:
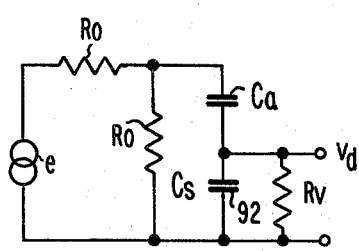

At low frequencies, for example, in the range of megahertz and down to hundreds of kilohertz, the space-coupling capacitance $C_a$ produces a reactance that is much larger than the resistance $R_a$. In addition, $C_a$ is fairly constant in this region, $C_s$ is lumped and also small. Under these conditions, the equivalent circuit reduces to that of FIG. 6B, in which the circuit acts as a capacitor divider. Therefore, the voltage across the diode resistance $R_v$ remains reasonably constant with frequency in this range. The ratio of the capacitances being relatively unaffected by frequency, the proportional voltage across the shunt capacitance (which determines the voltage across the diode resistance) also is relatively constant with frequency. This holds true down to the low frequency limit where the shunt reactance becomes greater than the diode video resistance. At that point, the circuit no longer acts as a capacitor divider, and the voltage across the diode is no longer constant with frequency. The diode video resistance for a suitable Schottky diode may be typically 300 kilohms. Thus, for the coupling capacitors, 92, 94, combined of about 12 pf, it has been found possible to maintain a three db broadband characteristic down to 100–200 kHz.

Figure 6C:
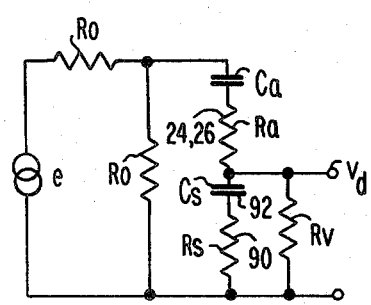

In the region of transition between the mid and low bands, the circuit takes the form of FIG. 6C. In this region, both $R_a$ and $C_a$ play a substantial role. The circuit maintains a substantially constant voltage across the diode where the changes in the resistance and reactance of the shunt circuit correspond to those of the antenna circuit. That is where the ratio of the shunt resistance to the shunt reactance is approximately equal to the ratio of the antenna resistance to the antenna reactance. Under these conditions, the ratio of the antenna impedance to the shunt impedance is approximately constant, and the impedance divider of FIG. 6C operates to maintain the voltage across the diode resistance substantially constant.

Thus, qualitatively, the extreme broadbanding is achieved by matching the characteristics of the resistive strip to those of the Schottky diode. Realizing that the detected, open circuited voltage of the diode depends only on the r-f voltage across it, it is evident that for any given external field intensity E, this r-f voltage must be kept constant, over the entire frequency spectrum. This is accomplished through the RC network shunting the diode. Thus, in the high frequency portion of the range, the predominantly resistive property of the resistive strip is matched by the predominantly resistive characteristic of the shunt network. Similarly, in the low frequency portion of the range, the predominantly capacitive nature of the strip (operating as a short dipole) is matched by the predominantly capacitive characteristic of the shunt network. In the transition region, their complex characteristics track each other with reasonable accuracy. The high and low frequency limits of this design depend on the inherent diode characteristics as well as the desired sensitivity. In the present case, a radiation density of 1 mw/cm$^2$ anywhere between 200 KHz and 26 GHz generates an output voltage of approximately 8 mV, corresponding to a 100 fold improvement in sensitivity over previous broadband probes.

In the transition region (e.g., 100 MHz to 1 GHz), there may be a decrease in sensitivity due to a frequency effect of $R_a$. By choosing $C_s$ to be somewhat lower than the nominal value called for by the similar ratios of resistance to reactance for the antenna and shunt networks, it is found that the sensitivity decrease at low frequency is offset.

It has been found that by forming the resistive strips on opposite faces of an extremely thin dielectric substrate 62, the area of interaction with the H-field is minimized. H-field effects are also minimized by fabrication of the shunt circuit, which also minimizes the area of interaction with the H-field.

For high powered applications, it is possible to extend the dynamic range of the diodes by operating them outside of their square-law region. When this is done, a separate compensating network for each leg would be provided to produce square-law signals, which are then summed to provide the signal proportional to E-field intensity. Alternatively, the shunt resistor can be made still smaller to shunt the larger proportion of the current, so that the diode does operate in the square-law region.

The following are typical values of a radiation probe constructed in accordance with the preferred embodiment. The resistance $R_a$ of the strip 24–26 is 6 kilohms, the resistance of strip 30 is 9 kilohms. The resistive strips are 1" long and less than 0.01" wide, and are thin film depositions of nichrome on a 2 mil Kapton substrate. The Schottky diode has a junction capacitance $C_j$ of 0.1 pf maximum, and a video resistance $R_v$ of 300 kilohms. The shunt resistance $R_s$ is 50 ohms. The capactiance $C_s$ of each shunt capacitor 92 is 25 pf (or where only a single shunt capacitor is used, it is 12 pf). The filtering capacitors 32 are each 100 pf chosen for a low frequency end of about 200 kHz. The capacitor 48 is 0.044 microfarads; the resistive leads 37, 39 are 27.5 kilohms, the capacitor 46 is 0.022 microfarads. The input impedance of the d-c amplifier 42 preferably is about 100 megohms. Sensitivity of the probe ranges from 0.01 to 20 mW/cm$^2$.

This invention may be used with probes extending in one or two directions, in the same fashion as in the isotropic unit described above, and the probe operates in the same way in each direction. Various types of barrier devices for r-f to d-c conversion may be used. The shunt network assembly may be simplified by using a single coupling capacitor 92, and connecting the shunt resistor directly to the contact 84 by bonding or by a conductive ribbon. Other modifications within the spirit of the following claims will be apparent to those skilled in the art.

Thus, applicant has provided a new and improved microwave detector that is effective for measuring free-space radiation over a broad band of radio frequencies, both in the microwave region and in lower frequencies. This radiation detector has a high sensitivity to measure extremely low thresholds of free-space radiation over a wide frequency band.

What is claimed is:

1. A monitor for detecting free-space radiation at radio frequencies in a broad band of microwave frequencies and in a broad band of lower frequencies; said monitor comprising:

a resistive strip having a d-c resistance that is substantially uniform over said radiation frequency range and larger than the characteristic impedance of free space for interacting with free-space radiation to have r-f currents induced therein in accordance with particular levels of the intensity of said free-space radiation, said r-f currents for corresponding radiation intensity levels in said band of microwave frequencies being substantially constant in amplitude with frequency, and said strip having in said microwave band a reactance small relative to said d-c resistance;

said strip being characterized by interacting with free-space radiation in said lower frequency band to produce for corresponding levels of radiation r-f currents of generally varying amplitude over said lower frequency band, and having in said lower band a reactance substantial in magnitude relative to said resistance;

a monitoring circuit including a barrier layer device having a substantial reactance in series with said resistive strip for converting r-f currents induced in said strip by free-space radiation to corresponding d-c signals, said monitoring circuit having means for presenting a resistance in shunt with the reactance of said barrier layer device, and means for presenting in shunt with the reactance of said barrier layer device small and substantial reactance values, respectively, in said microwave and lower frequency bands, and for varying in reactance with said strip reactance in said lower frequency band.

2. A monitor for detecting free-space radiation as set forth in claim 1 wherein, in said low frequency band, said resistive strip has a substantial capacitance, and the shunt resistance of said monitoring circuit is connected to form a resistance divider with the resistance of said strip, and said reactance varying means is connected to form a reactance divider with the reactance of said strip, whereby the r-f voltages across said barrier layer devicer corresponding to particular levels of radiation are substantially constant with respect to frequency over both said microwave and lower frequency bands.

3. A monitor for detecting free-space radiation as set forth in claim 2 and further comprising another resistive strip of the same construction and characteristics as the first-mentioned and extending in a transverse direction; and another monitoring circuit connected in series with said other strip and of the same construction and characteristics of the first mentioned monitoring circuit.

4. A monitor for detecting free-space radiation as set forth in claim 3 and further comprising a third resistive strip extending in a third transverse direction, and a third monitoring circuit connected in series, said third strip and monitoring circuit being of the same construction and characteristics of said other strips and circuits and arranged for isotropic monitoring of radiation.

5. A monitor for detecting free-space radiation as set forth in claim 4, wherein said resistive strips and associated monitoring circuits are each formed of thin films mounted on one face of a thin dielectric substrate thousandths of an inch thick, and further comprising a separate resistive thin film strip mounted on the opposite face of the associated substrate and parallel to and electrically connected to the outer end of each of said strips on said first face, and means connecting said strips in a direct series circuit.

6. A monitor for detecting free-space radiation as set forth in claim 4, wherein each of said strips is formed as two half strips spaced by a narrow gap, said barrier layer device being mounted across said gap, and said reactance and resistance means of each of said monitoring circuits includes a coupling capacitor mounted at said gap adjacent said barrier layer device, and connected to one of said half strips and another resistive strip having a d-c resistance substantially uniform over said frequency range and mounted to bridge said barrier layer device and connected between said coupling capacitor and the other of said half strips.

* * * * *